(12) United States Patent
Hu et al.

(10) Patent No.: US 9,185,825 B2
(45) Date of Patent: Nov. 10, 2015

(54) CONNECTION APPARATUS FOR ELECTRONIC DEVICE

(71) Applicant: ShenZhen Goldsun Network Intelligence Technology Co., Ltd., Shenzhen (CN)

(72) Inventors: Xiu-Quan Hu, Shenzhen (CN); Wei-Jin Fang, Shenzhen (CN); Ya-Ni Zhang, Shenzhen (CN)

(73) Assignee: ShenZhen Goldsun Network Intelligence Technology Co., Ltd., ShenZhen (CN)

( * ) Notice: Subject to any disclaimer, the term of this patent is extended or adjusted under 35 U.S.C. 154(b) by 182 days.

(21) Appl. No.: 13/972,316

(22) Filed: Aug. 21, 2013

(65) Prior Publication Data

US 2014/0179128 A1 Jun. 26, 2014

(30) Foreign Application Priority Data

Dec. 22, 2012 (CN) .......................... 2012 1 0561766

(51) Int. Cl.
*H01R 12/00* (2006.01)
*H05K 1/00* (2006.01)
*H05K 7/14* (2006.01)

(52) U.S. Cl.
CPC ............ *H05K 7/1492* (2013.01); *H05K 7/1487* (2013.01)

(58) Field of Classification Search
USPC .............................. 361/789, 785, 776; 439/77
See application file for complete search history.

(56) References Cited

U.S. PATENT DOCUMENTS 8,872,032 B2 * 10/2014 Lin et al. .................... 174/117 F
2013/0083505 A1 * 4/2013 Kobayashi .................... 361/785

* cited by examiner

*Primary Examiner* — Andargie M Aychillhum
(74) *Attorney, Agent, or Firm* — Novak Druce Connolly Bove + Quigg LLP

(57) ABSTRACT

A connection apparatus includes a back plate, a circuit board having two first connectors and two second connectors, and two connection lines. Each of the two connection lines includes a first signal transmission line and a second signal transmission line. A third connector is formed on the first signal transmission line. Two first bent portions extend from the first signal transmission line. A fourth connector is formed on each of the two first bent portions. A fifth connector is formed on the second signal transmission line. Two second bent portions extend from the second signal transmission line. A sixth connector is formed on each of the two second bent portions. The fourth connector is inserted into each of the two first connectors. The sixth connector is inserted into each of the two second connectors. Each of the third connector and the fifth connector is electrically connected to the back plate.

14 Claims, 6 Drawing Sheets

CONNECTION APPARATUS FOR ELECTRONIC DEVICE

BACKGROUND

1. Technical Field

The present disclosure relates to a connection apparatus for an electronic device.

2. Description of Related Art

Server computers include a plurality of cables to electrically connect peripheral devices with external devices. The plurality of cables interact with each other in the server computers, which may affect heat dissipation in the server computers.

Therefore, there is a need for improvement in the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean "at least one."

Figure 1:
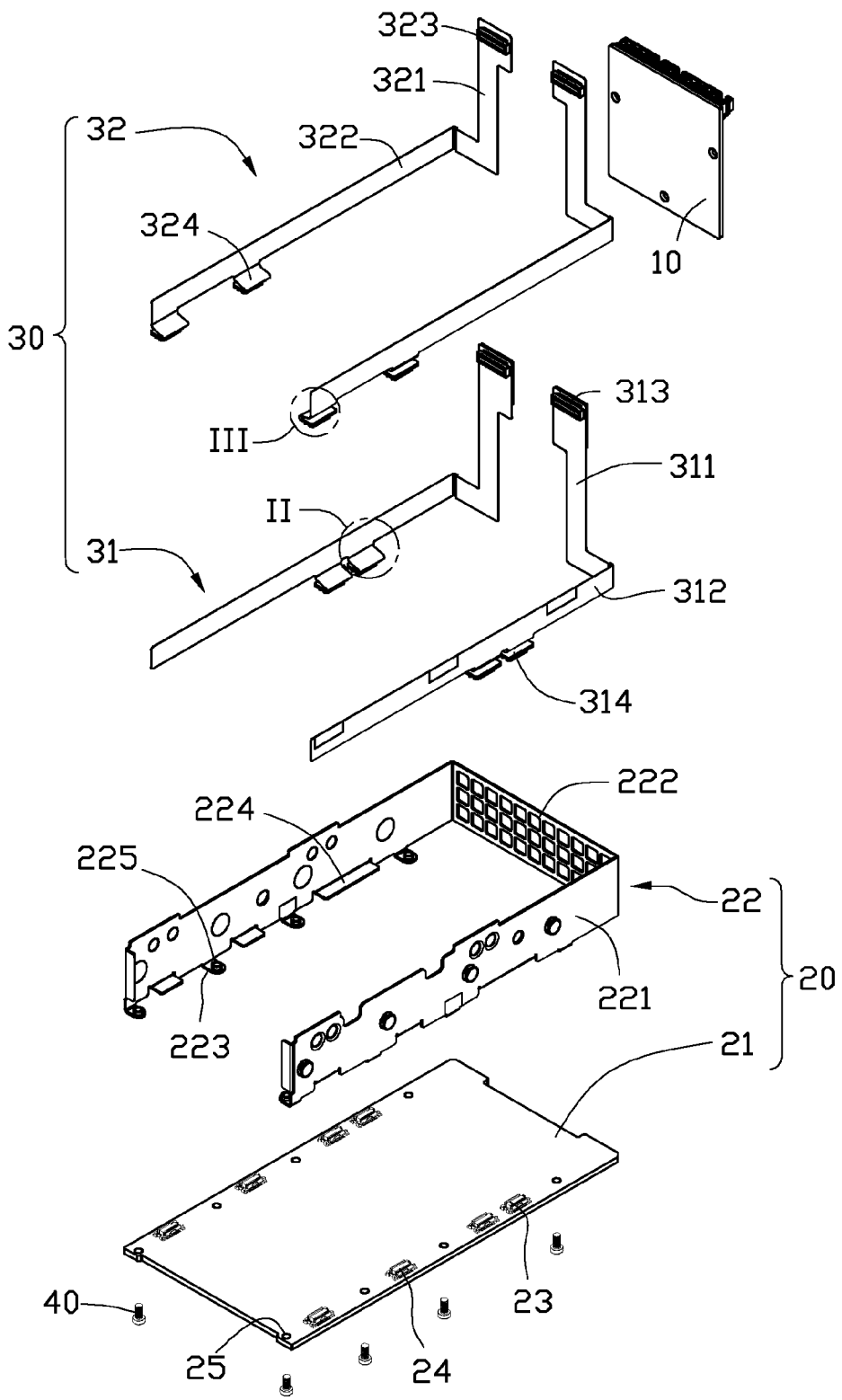
FIG. 1 is an isometric, exploded view of an embodiment of a connection apparatus for electronic device.
Figure 2:
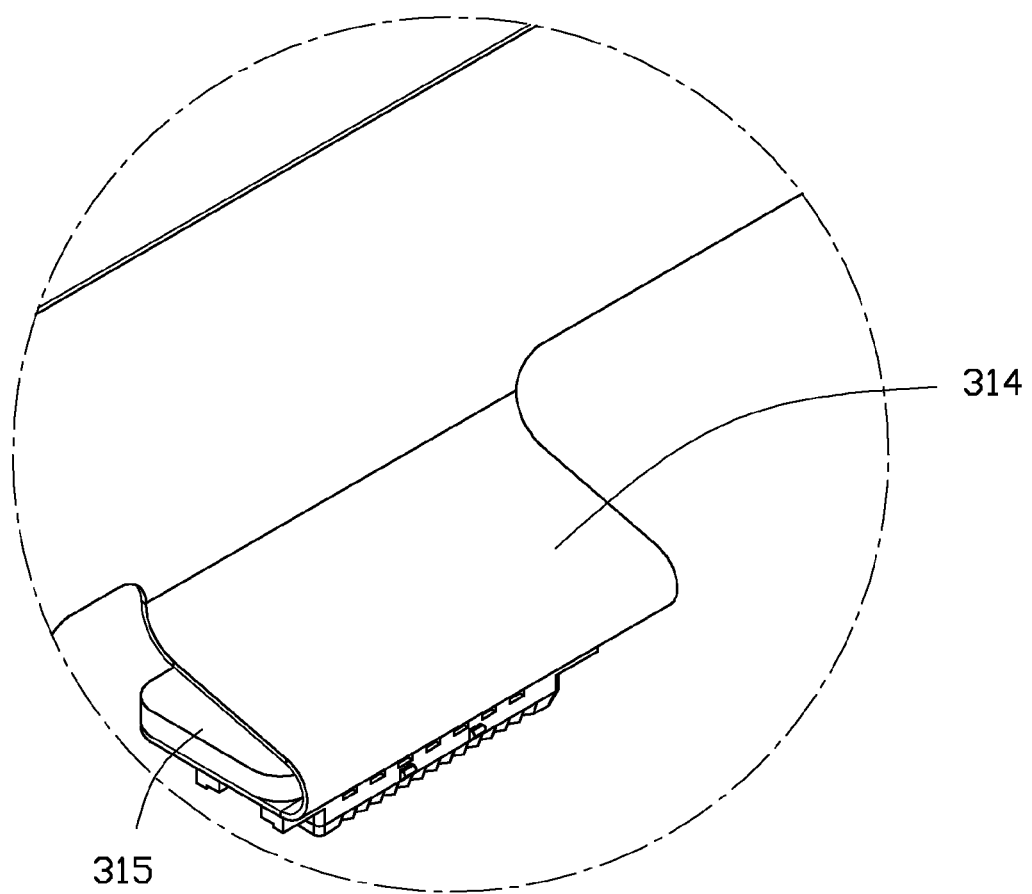
FIG. 2 is an enlarged view of a circled portion II of FIG. 1.
Figure 3:
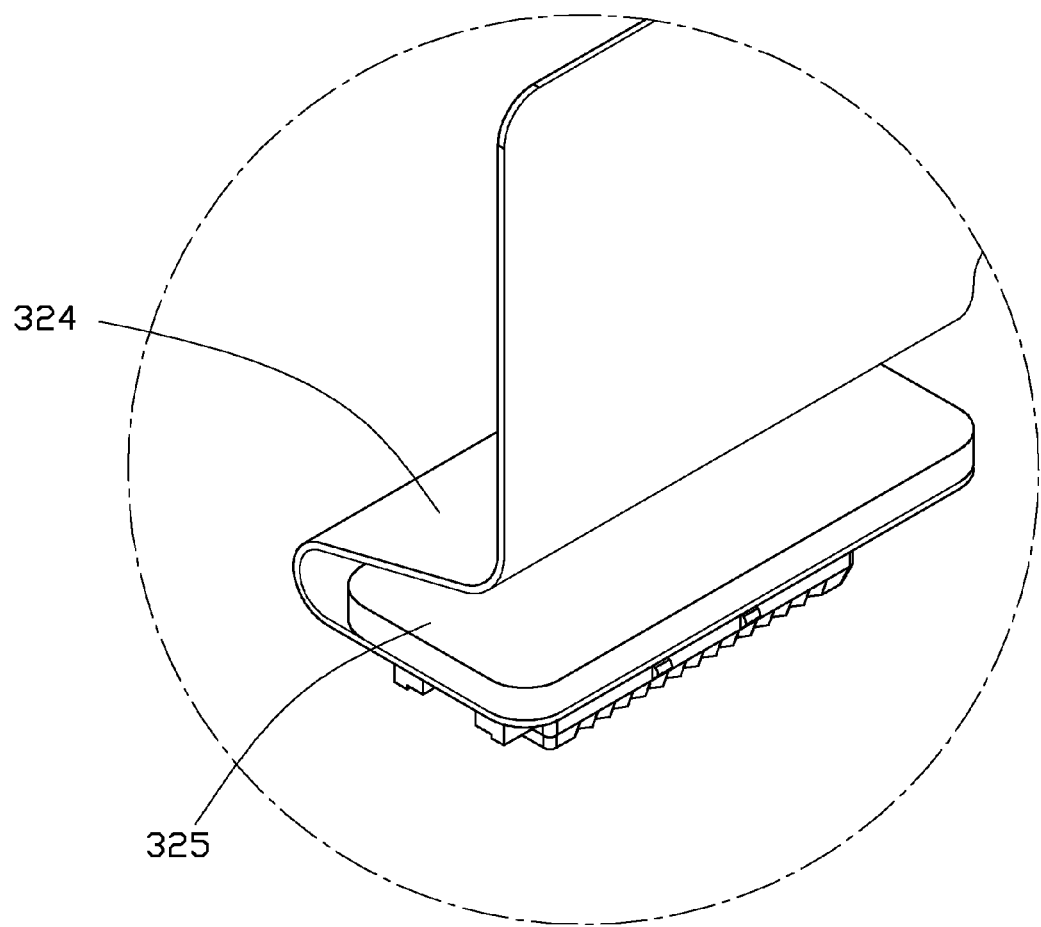
FIG. 3 is an enlarged view of a circled portion III of FIG. 1.
Figure 4:
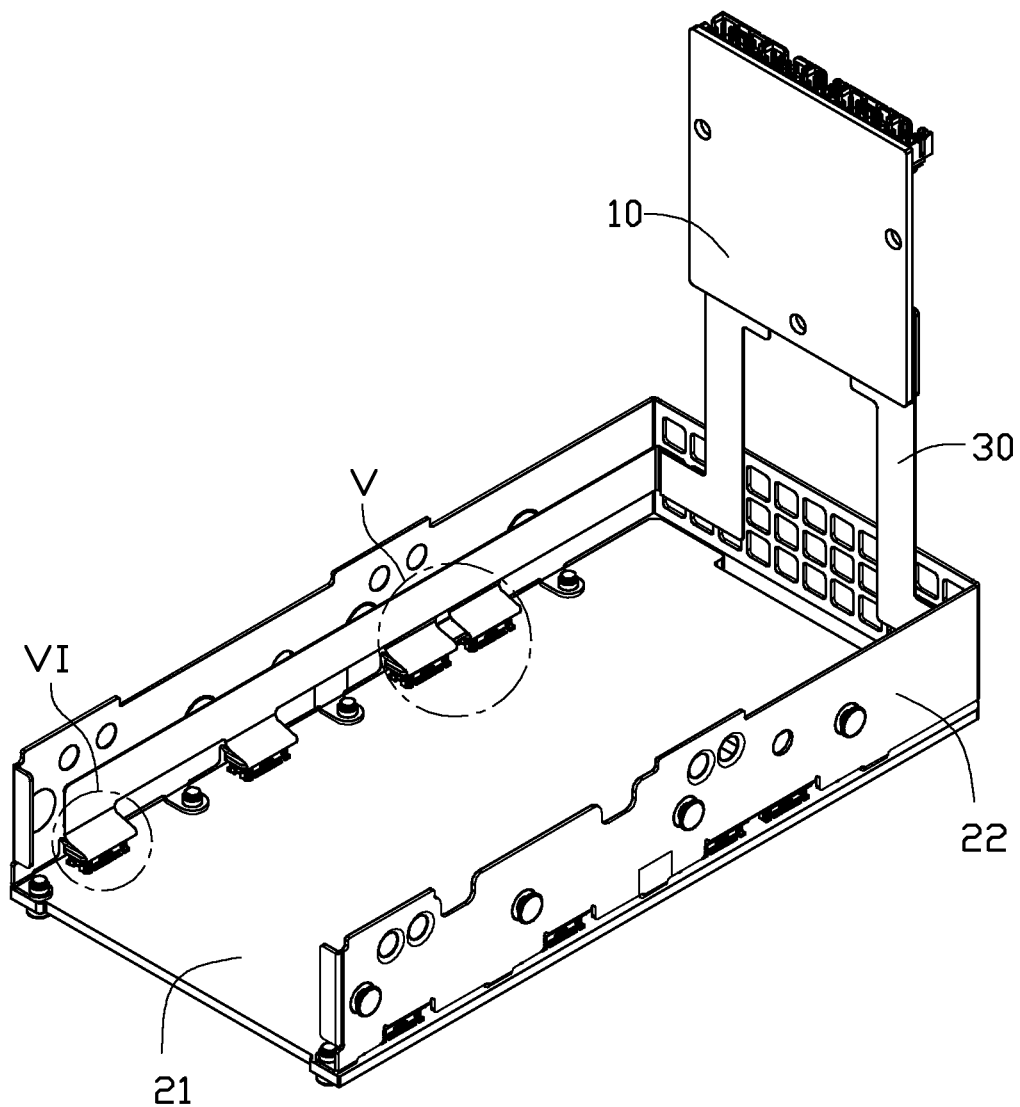
FIG. 4 is an assembled view of the connection apparatus for electronic device of FIG. 1.
Figure 5:
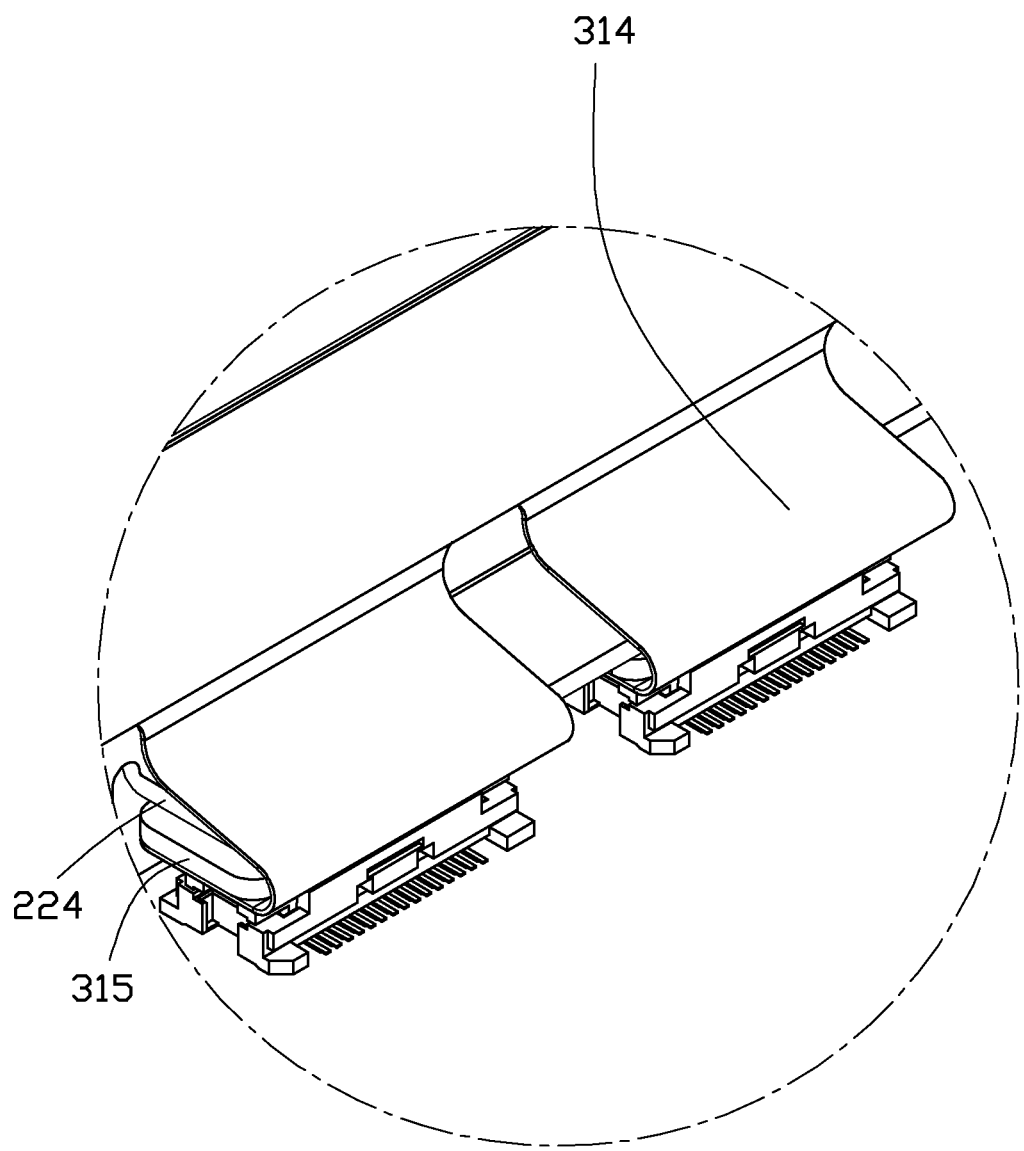
FIG. 5 is an enlarged view of a circled portion V of FIG. 4.
Figure 6:
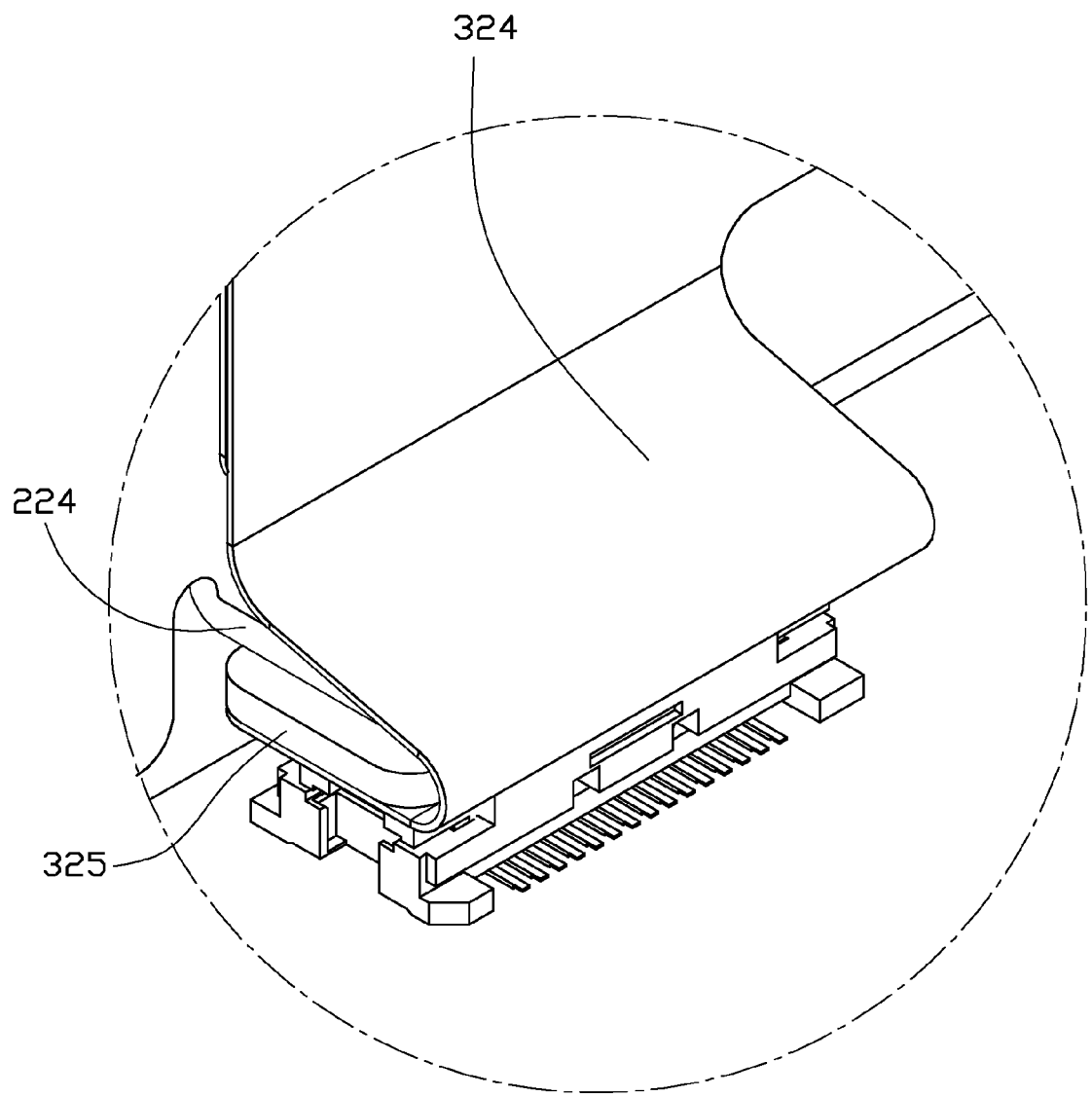
FIG. 6 is an enlarged view of a circled portion VI of FIG. 4.

FIGS. 1 to 3 show a connection apparatus for electronic device which includes a back plate 10, a power supply 20, and two connection lines 30 electrically connected to the back plate 10 and the power supply 20.

The power supply 20 includes a circuit board 21 and a bracket 22 mounted on the circuit board 21. Two first connectors 23 and two second connectors 24 are longitudinally formed on each of two sides of the circuit board 21. A plurality of round fixing holes 25 are longitudinally defined on each of two sides of the circuit board 21. The bracket 22 includes two parallel sidewalls 221 and a connecting wall 222 connected to the two sidewalls 221. A plurality of mounting portions 223 and resisting portions 224 substantially perpendicularly extend from a bottom of each of the two sidewalls 221. A round mounting hole 225 is defined on each of the plurality of mounting portions 223. In one embodiment, a diameter of the fixing hole 25 is equal to a diameter of the mounting hole 225.

Each of the two connection lines 30 includes a first signal transmission line 31 and a second signal transmission line 32 mounted on an inner side of the first signal transmission line 31. Each first signal transmission line 31 includes a first part 311 and a second part 312 substantially perpendicularly extending from the first part 311. A third connector 313 is formed on each first part 311. Two first bent portions 314 extend from each second part 312. A fourth connector 315 is formed on each first bent portion 314. Each second signal transmission line 32 includes a third part 321 and a fourth part 322 substantially perpendicularly extending from the third part 321. A fifth connector 323 is formed on each third part 321. Two second bent portions 324 extend from each fourth part 322. A sixth connector 325 is formed on each second bent portion 324.

FIGS. 1 to 6 show in assembly, the two connection lines 30 are moved toward the circuit board 21. The fourth connectors 315 of the first signal transmission line 31 are inserted in the corresponding first connectors 23 of the circuit board 21. The sixth connectors 325 of the second signal transmission line 32 are inserted in the corresponding second connectors 24 of the circuit board 21. The third connector 313 of the first signal transmission line 31 and the fifth connector 323 of the second signal transmission line 32 are electrically connected to the back plate 10. The bracket 22 is moved toward the circuit board 21. The mounting holes 225 are aligned with the corresponding fixing holes 25. The resisting portions 224 are inserted between the corresponding first bent portions 314 and the fourth connectors 315, and are inserted between the corresponding second bent portions 324 and the sixth connectors 325. The resisting portions 224 resist against top surfaces of the corresponding fourth connectors 315 and the sixth connectors 325. Therefore, a strength of the connection of the first signal transmission lines 31, the second signal transmission lines 32, and the circuit board 21 is strengthened. A plurality of fasteners 40 pass through the corresponding mounting holes 225 and the fixing holes 25. The bracket 22 is fixed on the circuit board 21. In one embodiment, the third connector 313 and the fifth connector 323 are soldered on the back plate 10. The first signal transmission lines 31 are mounted on inner sides of the two sidewalls 221 by gluing. Therefore, a layout space in the power supply 20 is saved.

Even though numerous characteristics and advantages of the present disclosure have been set forth in the foregoing description, together with details of the structure and function of the disclosure, the disclosure is illustrative only, and changes may be made in detail, especially in the matters of shape, size, and the arrangement of parts within the principles of the disclosure to the full extent indicated by the broad general meaning of the terms in which the appended claims are expressed.

What is claimed is:

1. A connection apparatus for an electronic device, comprising: a back plate; a circuit board having two first connectors and two second connectors; and two connection lines electrically connected to the back plate and the circuit board; wherein each of the two connection lines comprises a first signal transmission line and a second signal transmission line mounted on an inner side of the first signal transmission line; a third connector is formed on the first signal transmission line; two first bent portions extend from the first signal transmission line; a fourth connector is formed on each of the two first bent portions; a fifth connector is formed on the second signal transmission line; two second bent portions extend from the second signal transmission line; a sixth connector is formed on each of the two second bent portions; the fourth connector is inserted into each of the two first connectors; the sixth connector is inserted into each of the two second connectors; each of the third connector and the fifth connector is electrically connected to the back plate; and the back plate is electrically connected to the circuit board; a bracket mounted on the circuit board; the bracket comprises two parallel sidewalls and a connecting wall connected to the two sidewalls; a plurality of resisting portions substantially perpendicularly extending from each of the two sidewalls, wherein the plurality of resisting portions are inserted in the two first bent portions and the two second bent portions, respectively; and each of the plurality of resisting portions resists against top surfaces of the fourth connectors and the sixth connectors.

2. The connection apparatus of claim 1, further comprising a plurality of mounting portions substantially perpendicularly extending from each of the two sidewalls; a mounting hole is defined on each of the plurality of mounting portions; a plurality of round fixing holes are defined on each of two sides of the circuit board; and a plurality of fasteners each passing through the mounting hole and the fixing hole, wherein the bracket is fixed on the circuit board.

3. The connection apparatus of claim 2, wherein a diameter of the fixing hole is equal to a diameter of the mounting hole.

4. The connection apparatus of claim 1, wherein each of the first signal transmission line comprises a first part and a second part substantially perpendicularly extending from the first part; the third connector is formed on the first part; and each of the two first bent portions is formed on the second part.

5. The connection apparatus of claim 1, wherein each of the second signal transmission line comprises a third part and a fourth part substantially perpendicularly extending from the third part; the fifth connector is formed on the third part; and each of the two second bent portions is formed on the fourth part.

6. The connection apparatus of claim 1, wherein each of the third connector and the fifth connector are soldered on the back plate.

7. The connection apparatus of claim 1, wherein each of the first signal transmission lines is mounted on an inner side of each of the two sidewalls by gluing.

8. A connection apparatus for an electronic device, comprising: a back plate; a circuit board having two first connectors and two second connectors; a bracket mounted on the circuit board; wherein the bracket has a plurality of resisting portions; and two connection lines electrically connected to the back plate and the circuit board; wherein each of the two connection lines comprises a first signal transmission line and a second signal transmission line mounted on an inner side of the first signal transmission line; a third connector is formed on the first signal transmission line; two first bent portions extend from the first signal transmission line; a fourth connector is formed on each of the two first bent portions; a fifth connector is formed on the second signal transmission line; two second bent portions extend from the second signal transmission line; a sixth connector is formed on each of the two second bent portions; the fourth connector is inserted into each of the two first connectors; the sixth connector is inserted into each of the two second connectors; each of the third connector and the fifth connector is electrically connected to the back plate; the plurality of resisting portions are inserted in the two first bent portions and the two second bent portions, respectively; and the back plate is electrically connected to the circuit board; wherein the bracket comprises two parallel sidewalls and a connecting wall connected to the two sidewalls; the plurality of resisting portions substantially perpendicularly extending from each of the two sidewalls; and each of the plurality of resisting portions resists against top surfaces of the fourth connectors and the sixth connectors.

9. The connection apparatus of claim 8, further comprising a plurality of mounting portions substantially perpendicularly extending from each of the two sidewalls; a mounting hole is defined on each of the plurality of mounting portions; a plurality of round fixing holes are defined on each of two sides of the circuit board; and a plurality of fasteners each passing through the mounting hole and the fixing hole, wherein the bracket is fixed on the circuit board.

10. The connection apparatus of claim 9, wherein a diameter of the fixing hole is equal to a diameter of the mounting hole.

11. The connection apparatus of claim 8, wherein each of the first signal transmission line comprises a first part and a second part substantially perpendicularly extending from the first part; the third connector is formed on the first part; and each of the two first bent portions is formed on the second part.

12. The connection apparatus of claim 8, wherein each of the second signal transmission line comprises a third part and a fourth part substantially perpendicularly extending from the third part; the fifth connector is formed on the third part; and each of the two second bent portions is formed on the fourth part.

13. The connection apparatus of claim 8, wherein each of the third connector and the fifth connector are soldered on the back plate.

14. The connection apparatus of claim 8, wherein each of the first signal transmission lines is mounted on an inner side of each of the two sidewalls by gluing.

* * * * *